United States Patent
Sakayori et al.

(10) Patent No.: US 6,750,148 B2
(45) Date of Patent: Jun. 15, 2004

(54) METHOD OF MANUFACTURING WIRELESS SUSPENSION BLANK

(75) Inventors: Katsuya Sakayori, Tokyo (JP); Shigeki Kawano, Tokyo (JP); Hiroko Amasaki, Tokyo (JP); Kazuo Umeda, Tokyo (JP); Satoshi Sasaki, Tokyo (JP); Hiroshi Yagi, Tokyo (JP)

(73) Assignee: Dainippon Printing Co., Ltd., Tokyo (JP)

( * ) Notice: Subject to any disclaimer, the term of this patent is extended or adjusted under 35 U.S.C. 154(b) by 74 days.

(21) Appl. No.: 09/900,768

(22) Filed: Jul. 6, 2001

(65) Prior Publication Data
US 2002/0003127 A1 Jan. 10, 2002

(30) Foreign Application Priority Data

Jul. 7, 2000 (JP) .................................. 2000-206193
Jul. 7, 2000 (JP) .................................. 2000-206194

(51) Int. Cl.[7] .................. H01L 21/311; H01L 13/00; B44C 1/22
(52) U.S. Cl. .................. 438/699; 438/745; 216/20; 216/22
(58) Field of Search ................ 438/699, 745; 216/20, 22

(56) References Cited

U.S. PATENT DOCUMENTS

| 5,839,193 | A | | 11/1998 | Bennin et al. ............ 29/896.9 |
| 5,970,319 | A | * | 10/1999 | Banks et al. .............. 438/115 |
| 6,015,722 | A | * | 1/2000 | Banks et al. .............. 438/108 |
| 6,303,230 | B1 | * | 10/2001 | Watanabe et al. .......... 428/458 |

FOREIGN PATENT DOCUMENTS

JP         2000-49195         2/2000

* cited by examiner

*Primary Examiner*—Nadine G. Norton
*Assistant Examiner*—Lynette T. Umez-Eronini
(74) *Attorney, Agent, or Firm*—Flynn, Thiel, Boutell & Tanis, P.C.

(57) ABSTRACT

A method of manufacturing a wireless suspension blank wherein three-layered laminate formed of a metallic layer having a spring property and a conductive layer laminated on the metallic layer through an electrically insulating layer are used. The laminate used is a laminate in which an insulating layer is formed of a core-insulating layer and adhesive layers laminated on both sides of the core-insulating layer, and the ratio of higher etching rate to lower etching rate of the respective layers of the insulating layer is between 6:1 and 1:1. The metallic layer and the conductive layer are processed by the photo etching method. The insulating layer is processed by the wet etching method.

12 Claims, 4 Drawing Sheets

METHOD OF MANUFACTURING WIRELESS SUSPENSION BLANK

FIELD OF INDUSTRIAL USE

The present invention relates to a method of manufacturing a wireless suspension blank used in a hard disc drive (hereafter called "HDD") as a data storage device and others.

BACKGROUND OF INVENTION

Prior art concerning a method of manufacturing the above-mentioned member for electric parts is mentioned in Japanese Patent Laid-open 2000-49195, in which a method of manufacturing a wireless suspension blank used for HDD is not concretely explained. However, a method of manufacturing a member for electric parts is disclosed as follows.

In the manufacturing method, a three-layered laminate composed of a polyimide resin film and metallic foils laminated on both sides of the polyimide resin film is used as a laminate. In the method, resist patterns are formed on the metallic foils laminated on both sides of the polyimide, respectively, and the two metallic foils are treated at the same time with etching solution. Thereafter, resist patterns are removed from the two metallic foils, and then plasma etching of the polyimide resin film is done through one metallic foil etched as a mask to form the polyimide resin film into a pattern. Thereafter, the metallic foil used as a mask is removed from the polyimide resin film. As a result, a member for electronic part can be obtained which is composed of a laminate of the polyimide resin film formed into a pattern and the metallic foil formed into a pattern. This effect is that low-cost production is possible since reproduction is one time and a high quality product can be obtained in which a pattern of polyimide resin film is put on a pattern of metallic foil with a high positioning accuracy.

However, the above-mentioned method has a first problem in that the three-layered laminate used is high-priced.

Further, the above-mentioned method has a second problem in that the working of metallic foil is difficult since same requires a finer working accuracy, since wet etching is employed using etching solution applied to the metallic foils laminated on both sides of the polyimide resin film of three-layered laminates.

Further, the processing of polyimide film as the insulating layer has a problem that since it is carried out by the dry etching method, such as the plasma etching method, the product made by dry etching is high-priced.

Further, polyimide film has a fourth problem in that applying low-cost wet etching instead of dry etching is difficult.

In order to decrease the curve of a laminate used in the above-mentioned method, the coefficient of thermal expansion of the metallic layer is necessarily equalized with the coefficient of thermal expansion. Accordingly, it is desirable to use a low-expansible polyimide resin and others as an insulating layer.

However, since low-expansible polyimide does not have, in general, thermoplastic properties, low-expansible polyimide is deficient in adhesive properties for bonding to the metallic layer such that obtaining sufficient adhesive strength of the polyimide to the metallic layer is difficult. It is known to use thermoplastic polyimide resin and epoxy resin having good adhesive properties for bonding to the metallic layer as an adhesive layer layered between a metallic layer and low-expansible polyimide. Polyimide resin is used in, for example, adhesives used as a part of an insulating layer in a laminate of a wireless suspension blank, from the necessity that reliability on high insulating property should be maintained. In order to give insulating properties to polyimide resin, thermoplastic properties are given in general to polyimide resin. However, if the flexible structure giving thermoplastic properties is introduced into a frame of polyimide resin, there is a tendency for chemical resistance of the polyimide resin to be increased. Accordingly, there is a tendency for etching-ability to be decreased in the wet, process so that the etching rate of polyimide is away from the etching rate of the core-insulating layer, wherein "etching rate" means the amount of the decrease of thickness produced by etching per hour.

When a core-insulating layer is made of low-expansible polyimide, an adhesive layer is made of polyimide with adhesive properties and the core-insulating layer and the adhesive layer are combined so that an insulating layer made of a plurality of layers (for example, adhesive layer core-insulating layer/adhesive layer, adhesive layer/core-insulating layer) is formed. If etching by the wet process is given to the insulating layer of a plurality of layers, there is a tendency for etching-ability to be decreased, since the adhesive layer shows a tendency toward higher chemical resistance. However, since the core-insulating layer is apt to be etched, etching of the whole insulating layer does not proceed uniformly so that the shape of etching is not uniform. The goals of adjusting etching rates of a core insulating layer and an adhesive layer of an insulating layer in a laminate for a wireless suspension blank to a suitable amount, and to improve the adhesive properties of the adhesive layer conflict with each other, and so the coexistence of the former with the latter is difficult.

Therefore, with respect to a conventional laminate for a wireless suspension blank, the etching condition in the wet process is not known, and setting of a uniform etching condition is difficult. Accordingly, etching of the insulating layer is achieved by the dry process using plasma or laser etching in the present conditions.

The present invention was developed considering the above-mentioned background. The present invention aims at the provision of a method of manufacturing a wireless blank in which the working of a wireless suspension blank is possible with high accuracy.

The present applicant filed previously the application (Japanese Patent Application No. 186564 of 2000) concerning a laminate for a wireless suspension blank being an object of the present invention, in which wet etching is made accurately at a low-cost. Its content is as follows. Namely, this application says that an insulating layer is formed of two or more resin layers and a good shape of etching can be obtained, if the ratio of higher etching rate to a lower etching rate of the respective layers of the insulating layer is between 6:1 and 1:1, and preferably between 4:1 and 1:1. Accordingly, in the present application, an insulating layer having the above-mentioned constitution is employed so that good etching shape can be obtained in the wet etching process of an insulating layer.

Accordingly, a first method of manufacturing a wireless suspension blank according to the present invention is a method of manufacturing a wireless suspension blank in which a three-layered laminate formed of a metallic layer having a spring property and a conductive layer laminated on the metallic layer through an electrically insulating layer is used, wherein the laminate comprises the insulating layer formed of a core-insulating layer and adhesive layers applied on both sides of the core-insulating layer and with the ratio of higher etching rate to a lower etching rate of the respective layers of the insulating layer being between 6:1 and 1:1, preferably between 4:1 and 1:1, and the method comprises the steps of: a step for processing the metallic layer and the conductive layer by the photo etching method, respectively; a step for forming a resist pattern for processing the insulating layer; and a step for processing the insulating layer through the resist pattern by the wet etching method.

In the present invention, it is preferable to use a laminate having at least 300 g/cm of the adhesive strength of the adhesive layer to the metallic layer, the conductive layer and the core-insulating layer.

Further, it is preferable to use a laminate having the ratio of the thickness of the core-insulating layer to the thickness of the adhesive layer of 4:1 at maximum.

It is preferable to use a laminate in which at least one layer forming an insulating layer is made of polyimide resin or a laminate in which the whole layers forming an insulating layer are made of polyimide resin.

A second method of manufacturing a wireless suspension blank is a method of manufacturing a wireless suspension blank in which a two-layered laminate formed of a metallic layer having the spring property and a conductive layer laminated on the metallic layer through an electrically insulating layer is used, wherein as the laminate comprises the insulating layer formed of a core-insulating layer and adhesive layers and with the ratio of higher etching rate to a lower etching rate of the respective layers of the insulating layer of between 6:1 and 1:1, preferably between 4:1 and 1:1, and the method comprises the steps of: a step for processing the metallic layer by the photo etching method; a step for forming a wiring part on the insulating layer by the semi-additive method; a step of forming a resist pattern for processing the insulating layer; and a step for processing the insulating layer through the resist pattern by the wet etching method.

In the present invention, it is preferable to use a laminate having at least 300 g/cm of the adhesive strength of the adhesive layer to the metallic layer and the core-insulating layer.

Further, it is preferable to use a laminate having the ratio of the thickness of the core-insulating layer to the thickness of the adhesive layer of 4:1 at maximum.

It is preferable to use a laminate in which any or the two of the core-insulating layer and the adhesive are made of polyimide resin.

BEST MODE FOR CARRYING OUT THE INVENTION

A First Manufacturing Method

Figure 1A:
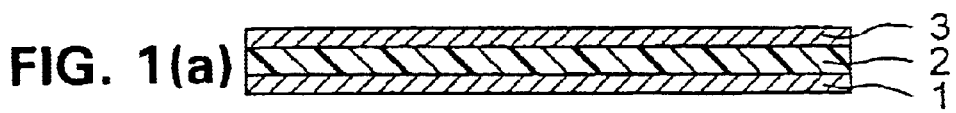
FIGS. 1(*a*), 1(*b*), 1(*c*), 1(*d*), 1(*e*), 1(*f*) and 1(*g*) are views for showing the process of a first manufacturing method.
Figure 1B:
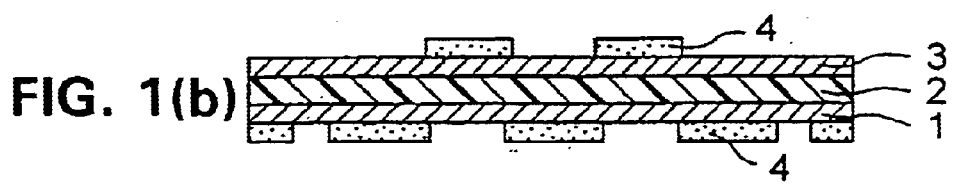
Figure 1C:
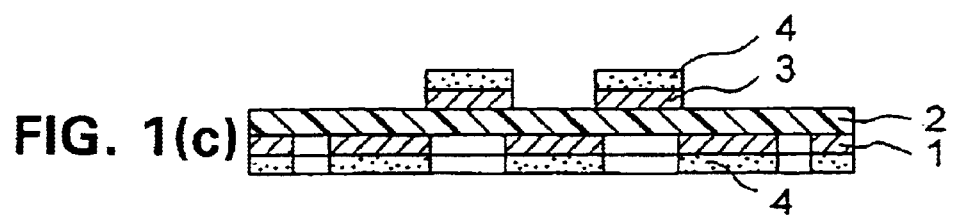
Figure 1D:
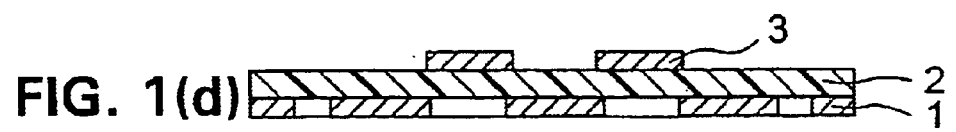
Figure 1E:
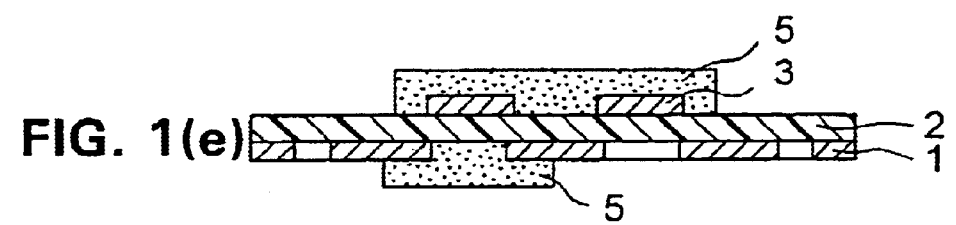
Figure 1F:
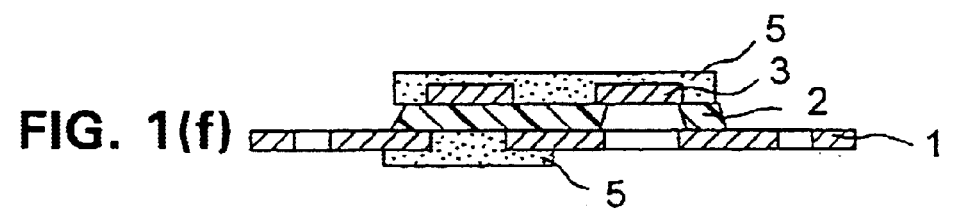
Figure 1G:
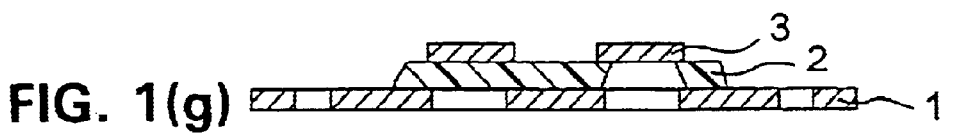

FIG. 1 shows a first manufacturing method, which is a view for showing one example of steps of a method of manufacturing a wireless suspension blank for HDD. The respective steps are explained in order as follows.

FIG. 1(*a*) shows a laminate for forming a wireless suspension blank. The laminate is formed of a stainless steel as a metallic layer 1 having the spring property and copper as a conductive layer 3 laminated on the metallic layer 1 through an insulating layer 2, wherein the insulating layer 2 used here is composed of a core-insulating layer and adhesive layers applied on both sides of the core-insulating layer.

FIG. 1(*b*) shows a state where dry film resists 4 of photosensitive material are laminated on the metallic layer 1 and the conductive layer 3, respectively, and the dry film resists 4 are formed into patterns through masks through a pattern exposure step and a developing step. Dry film resist is employed preferably as resist. However, liquid resist such as casein may be applied.

FIG. 1(*c*) shows a state where the metallic layer 1 and the conductive layer 3 are etched through patterns of the dry film resists 4. In this case, general etching solution consisting of iron (II) chloride is employed and each of the metallic layer 1 and the conductive layer 3 is etched in order by the one side lapping method.

FIG. 1(*d*) shows a state where after etching the metallic layer 1 and the conductive layer 3, dry film resists 4 are removed from the metallic layer 1 and the conductive layer 3 with stripper consisting of sodium hydroxide solution. As shown in FIG. 1(*d*), a three-layered laminate can be obtained, which laminate is formed of the insulating layer 2, the metallic layer 1 formed into a pattern and the conductive layer 3 formed into a pattern formed on both sides of the insulating layer 2.

FIG. 1(*e*) is a state where in order to process the insulating layer 2 by the wet etching method, resists 5 for processing the insulating layer are formed on an area of insulating layer 2 to be left on the lower face of the metallic layer 1 and on the upper face of the conductive layer 3. For this, resists 5 for processing the insulating layer are deposited on both sides of the insulating layer 2, according to a method such as the dip coating method, the roll coating method, the die coating method or the laminating method. The deposited resists 5 for processing the insulating layer are exposed through given mask patterns and developed to form patterns. The resist 5 for processing the insulating layer may be formed by the printing method, not by exposing and developing of resist.

FIG. 1(*f*) shows a state where insulating layer 2 is processed by wet etching. Wet etching may be carried out on a laminate with resist patterns on one side, or may be carried out at the same time to both sides of laminate with resist patterns. In case of wet etching being carried out on one side, there is the effect that the shape of the cross section formed is clear. In case of wet etching being carried out to both sides of the laminate, there is the effect that time required for the processing of the insulating layer is shortened.

FIG. 1(*g*) shows a state where resist for processing the insulating layer used as a mask member during wet etching is removed from the laminate, and the process of insulating layer 2 is finished. In the stripping step, the stripping is carried out in general using hot alkaline solution consisting of 1 to 20 wt % of sodium hydroxide solution heated to 50 to 70° C. However, in case of used polyimide being poor in alkali resistance, organic alkali may be used.

Finally, plating resist (not shown) is formed on wiring parts of a gimbal suspension comprised of a flexible substrate formed by the above-mentioned method, and Au plating is given to a conductive wiring part uncovered with plating resist. Further, cover layers as protective layers are formed at parts needed for the wiring parts. Au plating is the surface treatment for the electrical connection between a magnetic head slider (not shown) and a suspension and for the electrical connection between the suspension and a control side, wherein Au plating is preferably applied, however, this invention cannot be restricted as such. Ni/Au plating can be applied. Solder plating or printing can be substituted for plating. For example, when Ni plating is used, a gloss plating bath, a matt plating bath or a semi-gloss plating bath can be selected.

As above-mentioned, the production of a wireless suspension blank can be completed following the steps shown in FIG. 1. Thereafter, last, working such as machining is carried out so that a wireless suspension for HDD is finished.

EXAMPLE OF THE FIRST MANUFACTURING METHOD

Example 1

As a core-insulating layer polyimide film was used with a thickness of 12.5 µm ("APIKAL NPI" manufactured by Kanegafuchi Chemical Co. Ltd.). Polyimide varnish ("EN-20" manufactured by Nippon Rika Co. Ltd.) was deposited on both sides of the core-insulating layer to form a film (an insulating layer) with adhesive layers, in such a manner that the thickness of the film after drying was 2.5±0.3 µm. The film with adhesives was put between a stainless steel with a thickness of 20 mm ("304 HTA foil" manufactured by Shin Nippon Iron manufacturing Co. Ltd.) and a copper alloy foil ("C70250" manufactured by Ohlin Co. Ltd.), wherein the matt surface of the copper alloy foil faces the side of the film with adhesives. Pressure of 1 MPa was applied at 300° C. for 10 minutes to the stainless steel, the film with adhesive layers and the copper alloy foil, which are vacuum-pressure-welded, so that a laminate of a metallic layer, an insulating layer and a conductive layer is formed.

When the insulating layer was dipped into alkali-amine type of polyimide etching solution ("TPE-3000" manufactured by Tore Engineering Co. Ltd.) at 70° C., etching rates of the core-insulating layer and the adhesive layer of the insulating layer were 20 µm/min. and 11 µm/min., respectively, and the ratio of the two etching rates was 20:11. The change of thickness of film was measured at the same places as that in which the initial thickness of film was measured by means of a needle-contact-type thickness meter ("Dektak 16000" manufactured by Sloan Technology Co. Ltd.), wherein the amount of the decrease in thickness was computed by subtracting the thickness of the film after dipping from the initial thickness of the film.

Acrylic resin-type of dry film resists ("AQ-5038" manufactured by Asahi Chemical Co. Ltd.) were laminated on the upper face of the copper alloy foil and the lower face of the stainless steel, respectively. Thereafter, the two dry film resists were exposed through given photo mask patterns. The exposure was carried out by g rays at the amount of exposure of 30 to 60 mJ/cm__. Developing was made by spraying 1 wt % $Na_2Co_3$ at 30° C.

Then, Copper alloy foil was etched using iron (II) chloride solution under a state where the side of stainless steel was masked, and then dry film resist was removed from the copper alloy foil with stripping solution of sodium hydroxide. Further, the side of stainless steel was etched using iron (II) chloride under a state where the side of copper alloy foil was masked, and then dry film resist was removed from the stainless steel with stripping solution of sodium hydroxide. Thereby, a three-layered laminate having a pattern of copper alloy foil on one side of polyimide film and stainless steel and a pattern of stainless steel on the other side of the polyimide was obtained.

Then, resist for processing the polyimide was formed at areas where polyimide is to be left on the upper side of the polyimide having a wiring parts formed of the conductive layer and on the lower side of the polyimide having stainless steel formed into patterns. Concretely, acrylic resin-type of dry film resists ("AQ-5038" manufactured by Asahi Chemical Co. Ltd.) were laminated on the upper side and the lower'side of polyimide at 100° C., exposure was made by g rays at the amount of exposure of 30 to 60 mJ/cm__. Developing was achieved by spraying 1 wt % $Na_2Co_3$ at 30° C. to the dry film resist.

Then, etching solution ("TPE-30000" manufactured by Tore Engineering Co. Ltd.) was sprayed to the laminate having patterns from the two sides thereof so that part of the polyimide and part of the adhesive layers were removed. Thereafter, the dry film resists are removed by spraying 3% hot alkali solution at a spraying pressure of 1 kg on the dry film resist. The laminate to which wet etching was given in such a way was observed. As a result, it was found that a state of etching of the core-insulating layer and the adhesive layer was good. Further, better shapes of sections could be obtained by dipping the polyimide and the adhesive layer into the same etching solution to remove part of the polyimide and part of the adhesive layer.

Gold plating was given to the wiring part of the laminate formed as above-mentioned. Gold plating was carried out using the gold plating bath manufactured by Nippon Kojundo Chemical Co. Ltd. Concretely, Tenperesist Ex was used, wherein gold was deposited to the thickness of 1 µm by passing current at electric density Dk=0.4 $A/dm^2$ for about 4 minutes at 65° C. An epoxy resin-type of cover layer was formed at places needed for the wiring part as a covering layer, by which a wireless suspension blank for HDD was produced. Of course, the cover layer is not restricted to epoxy resin type of cover layer.

Example 2

The same laminate as that used in Example 1 was formed in the same manner as in Example 1, except that as a core-insulating layer a polyimide film was used having a thickness of 12.5 µm ("KAPTON EN" manufactured by Tore-Dupont Co. LTD.). Etching rates of the core-insulating layer and the adhesive layer of the laminate was about 7 µm/min. and 11 µm/min. The ratio of the two rates was 7:11.

The production of a wireless suspension blank was made using the same steps as in Example 1 using the laminate. As a result, it was found that etching of the core-insulating layer and the adhesive layers was made satisfactorily.

Comparative Example

Used as a core-insulating layer was polyimide film with a thickness of 12.5 µm ("APIKAL NPI" manufactured by Kanegafuchi Chemical Co. Ltd.). Poly-amic-acid varnish ("PAA-A" manufactured by Mitui Chemical Co. Ltd.) was deposited on both sides of the core-insulating layer to form a film (insulating layer) with adhesive layers, in such a manner that the thickness of the film after drying was 2.5±0.3 µm. Further, stainless steel used in Example 1 was laminated on the film with adhesive layers so that a laminate was obtained. Etching rates of the core-insulating layer and the adhesive layer were about 20 µm/min. and 1 µm/min. The ratio of the two rates was 20:1.

The production of a wireless suspension blank was carried out with the same steps as in Example 1 using the laminate.

As a result, it was found that etching of adhesive layers could not be made satisfactorily in that part of the adhesive layers was projected on the core-insulating layer.

A Second Manufacturing Method

Figure 2:
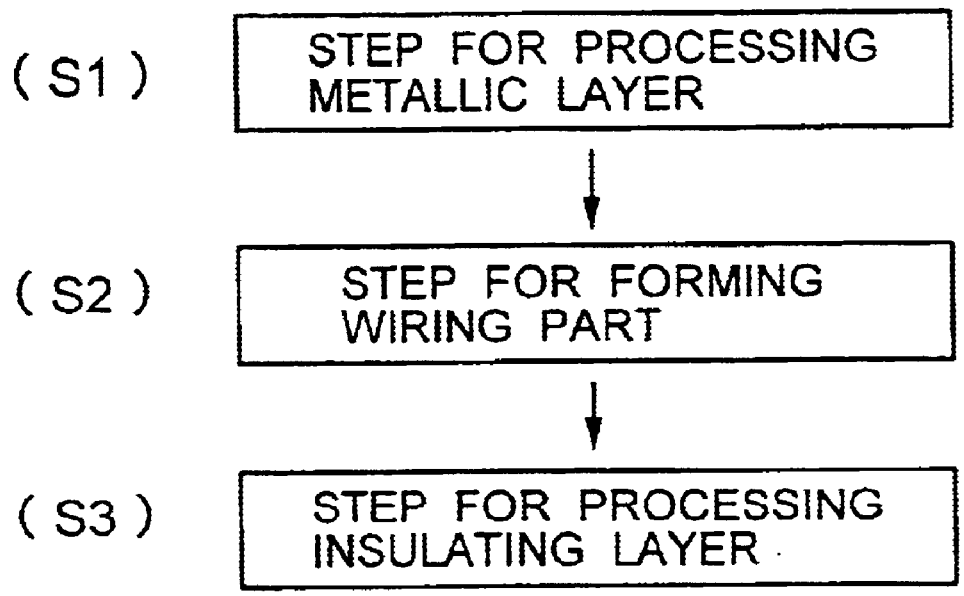
FIG. 2 is a flow sheet for explaining a second manufacturing method.

FIG. 2 illustrates a second manufacturing method according to the present invention, and a flow sheet for showing the basic steps of a method of manufacturing a wireless suspension blank.

In the second method, a wireless suspension blank is produced using a two-layered laminate comprised of a metallic layer having the spring property and an insulating layer according to the steps shown in FIG. 2. Namely, first, the processing step of the metallic layer is carried out in step 1(S1), and then the processing step of the wiring part is carried out in step 2(S2). Finally, the processing step of the insulating layer is carried out in step 3(S3).

In step 1, the metallic layer, such as stainless steel, of one side of the two-layered laminate is processed by the photo etching method. In step 2, metal such as copper is plated on an insulating layer such as a polyimide resin laminated on the metallic layer by the semi-additive method. In step 3, the resist pattern for processing the insulating layer is formed, and then the insulating layer is processed through the resist pattern by the wet etching method. A wireless suspension blank is produced through these three steps.

FIG. 3 and FIG. 4 show the second manufacturing method according to the present invention, and views for showing the procedure in the production of a wireless suspension blank. The steps of the production of a wireless suspension blank are explained in order.

Figure 3A:
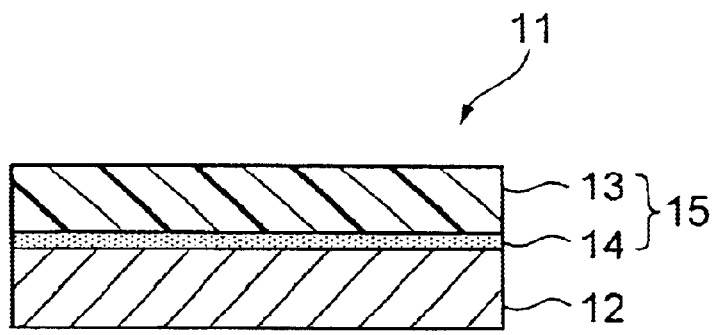
FIGS. 3(*a*), 3(*b*), 3(*c*) and 3(*d*) are views for showing the first half of the process of the second manufacturing method.

FIG. 3(a) shows a laminate 11 for forming a wireless suspension blank for HDD. The laminate 11 comprises a metallic layer 12 having the spring property and an insulating layer 15 laminated on the metallic layer 12, wherein the insulating layer 15 is comprised of a core-insulating layer 13 and an adhesive layer 14.

Figure 3B:
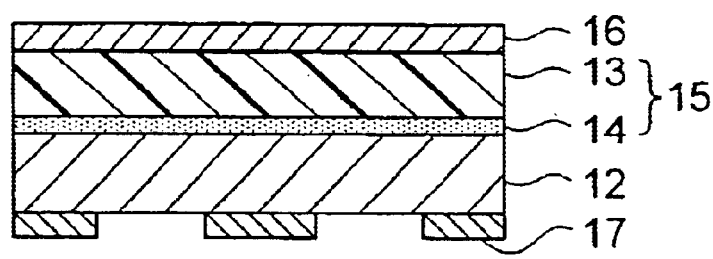

FIG. 3(b) shows a state where resists 16 are laminated on the upper face of the core-insulating layer 13 and the lower face of the metallic layer 12, respectively, and thereafter the pattern-exposure is made through given photo mask pattern to the resist laminated on the lower face of metallic layer 12 so that resist 17 having a pattern is formed. Dry film resist may be preferably used as resist. However, liquid resist such as casein may be used as resist.

Figure 3C:
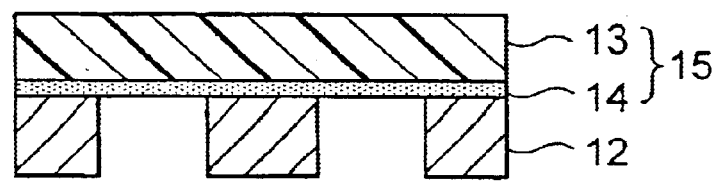

FIG. 3(c) shows a state where using public etching solution, one side of metallic layer 12 is etched and thereafter resists 16, 17 are removed from the metallic layer 12 with stripping solution. As shown in FIG. 3(c), a two-layered laminate including the metallic layer 12 having patterns on one side of insulating layer 15 can be obtained.

Figure 3D:
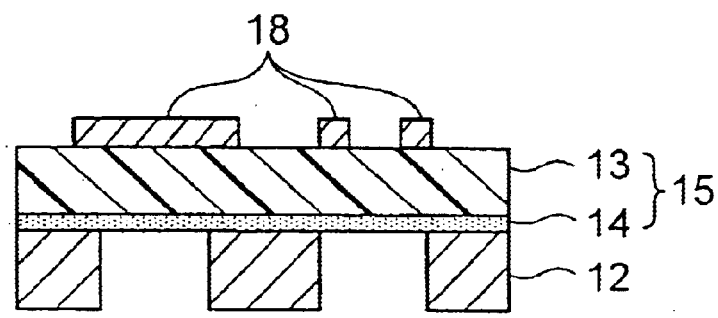

FIG. 3(d) shows a state where conductive material put on the side contrary to the side of metallic layer 12 of the insulating layer 15 is formed into a pattern so as to form a wiring part 18, wherein after a feeding layer is formed on the upper face of insulating layer 15 and on the face of the metallic layer having patterns 12, and then resists of photosensitive material are formed on the upper face of insulating layer 15 and on the lower face of the insulating layer 15 having metallic layer 12 formed into a pattern, and the exposure is made through given photo mask pattern to the resist formed on the upper side of insulating layer 15, and the exposed resist is developed to form a resist pattern. Then, an additive copper pattern is formed using the feeding layer formed on the upper face of insulating layer 15. Thereafter, resists are removed, while the feeding layer is removed.

Figure 4A:
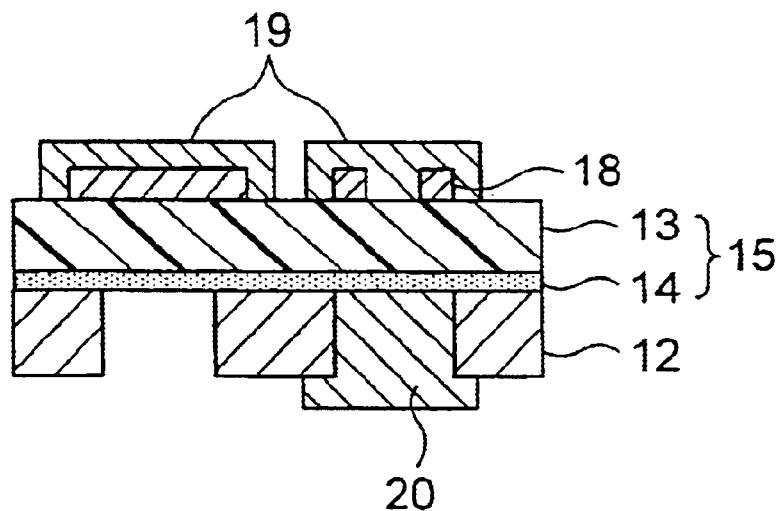
FIGS. 4(*a*), 4(*b*) and 4(*c*) are views for showing the second half of the process of the second manufacturing method.

FIG. 4(a) shows a state where in order to process the insulating layer 15 by wet etching, resists 19, 20 for processing the insulating layer are formed at areas of the insulating layer 15 to be left on the upper face of insulating layer 15 and on the lower face of insulating layer having metallic layer 12 formed into patterns. For this, resists 19, 20 for processing the insulating layer are deposited on both sides of insulating layer 15, according to methods such as the dip coating method, the roll coating method, the die coating method or the laminating method. The deposited resists are exposed through given mask patterns. The exposed resists are developed. Of course, resists for processing the insulating layer may be formed by the printing method, not by exposing and developing of resist.

Figure 4B:
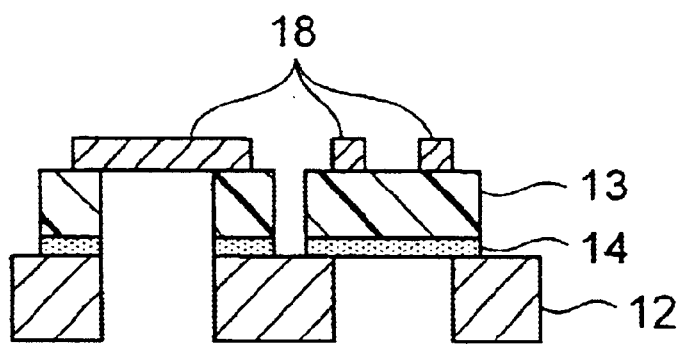

FIG. 4(b) shows a state where insulating layer 15 is processed by the wet etching method. Wet etching may be carried out on a laminate having resist patterns on one side, or may be carried out at the same time to both sides of laminate having resist patterns. Thereafter, resists 19, 20 for processing the insulating layer used as masking members of wet etching are removed, by which the processing of insulating layer 15 is finished. Where wet etching is carried out on one side, there is the effect that the shape of the cross section formed is clear. Where wet etching is carried out on both sides of the laminate, there is the effect that the time required for the processing of the insulating layer is shortened.

Figure 4C:
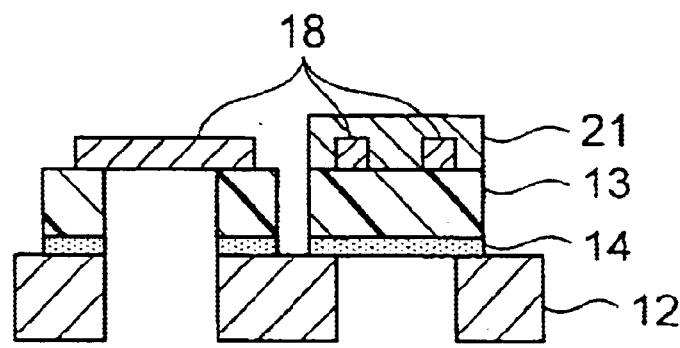

FIG. 4(c) shows a state where Au plating is given on wiring part 18 of the laminate formed as above-mentioned as a finishing part of the process, and cover layer 21 as a protective layer is formed at places needed for the wiring part. Au plating is the surface treatment for the electrical connection between a magnetic head slider (not shown) and a suspension and for the electrical connection between the suspension and a control side, wherein Au plating is preferably applied. However, this invention cannot be restricted to the above. Ni/Au plating can be applied. Solder plating or printing can be substituted for plating. For example, when Ni plating is used, a gloss plating bath, a matt plating bath or a semi-gloss plating bath can be selected.

As above-mentioned, the production of a wireless suspension blank can be completed following the steps shown in FIG. 3 and FIG. 4. Thereafter, last, work (not shown) such as machining is carried out so that a wireless suspension for HDD is finished.

EXAMPLE OF THE SECOND MANUFACTURING METHOD

Example 1

As a core-insulating layer, polyimide film with thickness of 12.5 $\mu$m ("APIKAL NPI" manufactured by Kanegafuchi Chemical Co. Ltd.) was used. Polyimide varnish ("EN-20" manufactured by Nippon Rika Co. Ltd.) was deposited on one side of the core-insulating layer to form a film (insulating layer) with adhesive layers, in such a manner that the thickness of the film after drying was 2.5±0.3 $\mu$m. The film with the adhesive layer was laminated with stainless steel ("304HTA foil" manufactured by Shin Nippon Iron Manufacturing Co. Ltd.). Thereafter, a pressure of 1 MPa was applied at 300° C. for 10 minutes to the film adhesive layer laminated with stainless steel, which are vacuum-pressure-welded so that a laminate was formed.

When the insulating layer was dipped into alkali-amine type of polyimide etching solution ("TPE-3000" manufactured by Tore Engineering Co. Ltd.) at 70° C., etching rates of the core-insulating layer and the adhesive layer of the insulating layer were 20 $\mu$m/min, and 11 $\mu$m/min., respectively, and the ratio of the two etching rates was 20:11. The change of thickness of the film was measured at the same places as that in which initial thickness of film was measured by means of a needle-contact-type thickness meter ("Dektak 16000" manufactured by Sloan Technology Co. Ltd.), wherein the amount of decrease in thickness was computed by subtracting the thickness of film after dipping from the initial thickness of film.

Acrylic resin-type of dry film resists ("AQ-5038" manufactured by Asahi Chemical Co. Ltd.) was laminated on the upper face of polyimide film and the lower face of stainless steel at 100° C. Thereafter, the resist laminated on the lower face of the stainless steel was exposed through given photo mask patterns. Exposure was carried out by g rays at the amount of exposure of 30 to 60 mJ/cm__. Developing was made by spraying 1 wt % $Na_2Co_3$ at 30° C.

Then, public etching solution of iron (II) chloride was used. By the one side lapping method one side of stainless steel was etched. Thereafter, dry film resist was removed from the stainless steel by stripping solution of sodium hydroxide so that a two-layered laminate having a pattern of stainless steel formed on one side of the polyimide film could be obtained.

Then, a feeding layer was formed on the upper face of the polyimide film and then resists were formed on the face of the upper face of the polyimide film and on the face of the polyimide having stainless steel formed into a pattern. The resist formed on the upper face of the polyimide was exposed through given photo mask pattern and the exposed resist was developed to form a resist pattern. Thereafter, an additive copper pattern was formed using the feeding layer formed on the upper face of the polyimide according to the resist pattern. Thereafter, the resist was removed from the polyimide film while the feeding layer was removed from the polyimide film.

Further, resists for processing the polyimide were formed at areas of the polyimide film to be left on the upper face of the polyimide film having a wiring part and on the lower face of stainless steel. Concretely, dry film resists ("AQ-5038" manufactured by Asahi Chemical Co. Ltd.) were laminated on the upper face of the polyimide film having a wiring part and the lower face of stainless steel at 100° C. Exposure was carried out by g rays at the amount of exposure of 30 to 60 mJ/cm__. Developing was made by spraying 1 wt % $Na_2Co_3$ at 30° C.

Then, etching solution ("TPE-3000" manufactured by Tore Engineering Co. Ltd.) was sprayed on the laminate having patterns from the two sides thereof so that part of the polyimide and part of the adhesive layers were removed. Thereafter, the dry film resists are removed by spraying 3% hot alkali solution at a spraying pressure of 1 kg to the dry film resist. In such a way, the laminate to which wet etching was given in such a way was observed. As a result, it was found that a state of etching of the core-insulating layer and the adhesive layer was good. Further, better shape of sections could be obtained by dipping the polyimide and the adhesive layer into the same etching solution to remove part of the polyimide and part of the adhesive layer.

Gold plating was given to the wiring part of the laminate formed as above-mentioned. Gold plating was carried out using the gold plating bath manufactured by Nippon Kojundo Chemical Co. Ltd. Concretely, Tenperesist Ex was used, wherein gold was deposited to the thickness of 1 $\mu$m by passing current at electric density Dk=0.4 A/ $dm^2$ for about 4 minutes at 65° C. An epoxy resin-type of cover layer was formed at places needed for the wiring parts as covering layers, by which a wireless suspension blank for HDD was produced. Of course, a cover layer is not restricted to the epoxy resin type of cover layer.

Example 2

The same laminate as used in Example 1 was formed in the same manner as that in Example 1, except that as the core-insulating layer a polyimide film having thickness of 12.5 $\mu$m ("KAPTON EN" manufactured by Tore-Dupont Co. LTD.) was used. Etching rates of the core-insulating layer and the adhesive layer of the laminate was about 7 $\mu$m/min. and 11 $\mu$m/min. And the ratio of the two rates was 7:11.

The production of a wireless suspension blank was made by employing the same steps as in Example 1 using the laminate. As a result, it was found that etching of the core-insulating layer and the adhesive layers was made satisfactorily.

Comparative example

As a core-insulating layer polyimide film with a thickness of 12.5 $\mu$m ("APIKAL NPI" manufactured by Kanegafuchi Chemical Co. Ltd.) was used. Poly-amic-acid varnish ("PAA-A" manufactured by Mitui Chemical Co. Ltd.) was deposited on both sides of the core-insulating layer to form a film (insulating layer) with adhesive layers, in such a manner that the thickness of film after drying was 2.5±0.3 $\mu$m. Further, stainless steel used in Example 1 was laminated on the film with adhesive layers so that a laminate was obtained. Etching rates of the core-insulating layer and the adhesive layer were about 20 $\mu$m/min. and 1 $\mu$m/min, respectively, and the ratio of the two rates was 20:1.

The production of a wireless suspension blank was made by employing the same steps as in Example 1 using the laminate. As a result, it was found that etching of the adhesive layers could not be made satisfactorily in that part of the adhesive layers was projected on the core-insulating layer.

According to the first manufacturing method of the present invention, low-cost production becomes possible since the processing of the polyimide is achieved by the wet etching method, so that a method of manufacturing a wireless suspension blank is produced in which it becomes possible to work a wiring part at low cost with high accuracy.

According to the second manufacturing method of the present invention, reduction in production cost becomes possible by using a two-layered laminate. Further, it becomes possible to work the fine wiring part with high accuracy by forming a wiring part by the semi-additive method. Further, production costs are reduced since the processing of polyimide as insulating layer by wet etching is carried out with high accuracy. As a result, it becomes possible to provide a method of manufacturing a wireless suspension blank in which the fine working of a wiring part is possible at a low cost.

What is claimed is:

1. A method of manufacturing a wireless suspension blank, said method comprising the steps of:
   providing a three-layer laminate including a metallic layer having spring properties, a conductive layer laminated on the metallic layer through an electrically insulating layer, the insulating layer including a core-insulating layer and adhesive layers disposed on opposite sides of the core-insulating layer;
   photo-etching the metallic layer and the conductive layer;

after said step of photo-etching, forming respective resist patterns on the metallic layer and the conductive layer on sides thereof facing away from the insulating layer; and after said step of forming, wet etching the insulating layer through the respective resist patterns such that a ratio of higher etching rate to lower etching rate of the respective layers of the insulating layer is between 6:1 and 1:1.

2. The method of claim 1 wherein the ratio of higher etching rate to lower etching rate of the respective layers of the insulating layer is between 4:1 and 1:1.

3. The method of claim 1 wherein said step of providing includes providing a three-layer laminate wherein the adhesive strength of the adhesive layers relative to the metallic layer, the conductive layer and the core-insulating layer is at least 300 g/cm.

4. The method of claim 1 wherein said step of providing includes providing a three-layer laminate wherein the ratio of the thickness of the core-insulating layer to the thickness of the adhesive layers is a maximum of 4:1.

5. The method of claim 1 wherein said step of providing includes providing an insulating layer having at least one layer of polyimide resin.

6. The method of claim 1 wherein said step of providing includes providing an insulating layer constructed entirely of polyimide resin.

7. The method of claim 1 wherein said step of wet etching includes wet etching the insulating layer in alkali solution.

8. A method of manufacturing a wireless suspension blank, said method comprising the steps of:

providing a two-layer laminate including a metallic layer having spring properties, an insulating layer laminated on the metallic layer, the insulating layer including a core-insulating layer of polyimide resin and adhesive layers of polyimide resin laminated on the core-insulating layer;

photo-etching the metallic layer;

after said step of photo-etching and after said step of forming a wiring part, forming a wiring part on the insulating layer by the semi-additive method;

forming respective resist patterns on the wiring part and on the metallic layer; and after said step of forming, wet etching the insulating layer through the respective resist patterns such that the ratio of higher etching rate to lower etching rate of the respective layers of the insulating layer is between 6:1 and 1:1.

9. The method of claim 8 wherein the ratio of higher etching rate to lower etching rate of the respective layers of the insulating layer is between 4:1 and 1:1.

10. The method of claim 8 wherein said step of providing includes providing a two-layer laminate wherein the adhesive strength of the adhesive layers is at least 300 g/cm.

11. The method of claim 8 wherein said step of providing includes providing a two-layer laminate wherein the ratio of the thickness of the core-insulating layer to the thickness of the adhesive layers is a maximum of 4:1.

12. The method of claim 8 wherein said step of wet etching includes wet etching the insulating layer with alkali solution.

* * * * *